(12) United States Patent
Li et al.

(10) Patent No.: US 7,579,657 B2
(45) Date of Patent: Aug. 25, 2009

(54) SEMICONDUCTOR DEVICE WITH MULTIPLE CHANNELS

(75) Inventors: Ming Li, Suwon-si (KR); Kyoung-hwan Yeo, Seoul (KR); Sung-min Kim, Incheon Metropolitan (KR); Sung-dae Suk, Seoul (KR); Dong-won Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 273 days.

(21) Appl. No.: 11/517,211

(22) Filed: Sep. 7, 2006

(65) Prior Publication Data
US 2007/0158679 A1 Jul. 12, 2007

(30) Foreign Application Priority Data
Dec. 31, 2005 (KR) ............... 10-2005-0136267

(51) Int. Cl.
*H01L 29/786* (2006.01)
(52) U.S. Cl. ............... 257/354; 257/E21.415
(58) Field of Classification Search .......... 257/353, 257/354, 288, E27.099, E21.415
See application file for complete search history.

(56) References Cited

U.S. PATENT DOCUMENTS

| 6,855,606 | B2 | 2/2005 | Chen et al. | ......... 438/283 |
|---|---|---|---|---|
| 2003/0057486 | A1* | 3/2003 | Gambino et al. | ......... 257/347 |
| 2004/0036128 | A1* | 2/2004 | Zhang et al. | ......... 257/401 |
| 2005/0056892 | A1* | 3/2005 | Seliskar | ......... 257/348 |
| 2005/0142721 | A1 | 6/2005 | Koh | ......... 438/197 |

FOREIGN PATENT DOCUMENTS

JP 2003-347434 12/2003

* cited by examiner

*Primary Examiner*—Jerome Jackson, Jr.
*Assistant Examiner*—Paul A Budd
(74) *Attorney, Agent, or Firm*—Mills & Onello, LLP

(57) ABSTRACT

A semiconductor device with multiple channels includes a semiconductor substrate and a pair of conductive regions spaced apart from each other on the semiconductor substrate and having sidewalls that face to each other. A partial insulation layer is disposed on the semiconductor substrate between the conductive regions. A channel layer in the form of at least two bridges contacts the partial insulation layer, the at least two bridges being spaced apart from each other in a first direction and connecting the conductive regions with each other in a second direction that is at an angle relative to the first direction. A gate insulation layer is on the channel layer, and a gate electrode layer on the gate insulation layer and surrounding a portion of the channel layer.

9 Claims, 10 Drawing Sheets

SEMICONDUCTOR DEVICE WITH MULTIPLE CHANNELS

CROSS-REFERENCE TO RELATED PATENT APPLICATION

This application claims priority to Korean Patent Application No. 10-2005-0136267, filed on Dec. 31, 2005, in the Korean Intellectual Property Office, the disclosure of which is incorporated herein in its entirety by reference.

BACKGROUND OF THE INVENTION

1. Field of the Invention

The present invention relates to a semiconductor device and a method of fabricating the same, and more particularly, to a semiconductor device with multiple channels in which a gate electrode layer partially encompasses a channel layer and a method of fabricating the same.

2. Description of the Related Art

As the application fields of semiconductor devices have been expanded, the demand for highly integrated and high-speed semiconductor devices continues to rapidly increase. The recent large integration scale of semiconductor devices has resulted in a significant decrease in the design rule of devices. As a result, the channel length and the channel width of a field effect transistor (FET) continues to decrease as well. A decreased channel width can cause the well-known short channel effect to occur, in which the electric potential of the device source region and drain region have a severe impact on the channel layer. For a transistor using a shallow trench device isolation layer, a narrow channel decreases the threshold voltage level. Therefore, various types of FETs have been proposed to reduce the short channel effect and/or the narrow channel effect.

One proposed FET is a gate-all-around transistor (GAAT) in which a channel layer, such as a nanowire, encompasses the gate electrode layer. Recently, a sacrificial layer, for instance, a silicon germanium (SiGe) layer has been used for GAAT-type devices.

However, in a conventional GAAT, when the gate electrode layer is trimmed, an upper portion and a lower portion of the gate electrode layer have a different thickness. Specifically, the upper portion of the gate electrode layer is thinner than the lower portion thereof, and thus, the gate electrode layer becomes non-uniform. In addition, any sacrificial layer remaining on source and drain regions often causes an incidence of leakage current in which current, in general, leaks toward the lateral sides of source and drain regions or toward a semiconductor substrate. Furthermore, an unintended parasitic channel may be formed on the gate electrode layer and the semiconductor substrate, and the unintended parasitic channel can result in degradation of material properties of the semiconductor devices.

SUMMARY OF THE INVENTION

The present invention provides a semiconductor device with multiple channels, wherein a gate electrode layer has a uniform thickness and the generation of leakage current and formation of the parasitic channel can be reduced.

The present invention also provides a method of fabricating a semiconductor device with multiple channels, wherein a gate electrode layer has a uniform thickness and the generation of leakage current and formation of the parasitic channel can be reduced.

In one aspect, the present invention is directed to a semiconductor device with multiple channels comprising: a semiconductor substrate; a pair of conductive regions spaced apart from each other on the semiconductor substrate and having sidewalls that face to each other; a partial insulation layer disposed on the semiconductor substrate between the conductive regions; a channel layer in the form of at least two bridges contacting the partial insulation layer, the at least two bridges being spaced apart from each other in a first direction and connecting the conductive regions with each other in a second direction that is at an angle relative to the first direction; a gate insulation layer on the channel layer; and a gate electrode layer on the gate insulation layer and surrounding a portion of the channel layer.

In one embodiment, the conductive regions are impurity doped source and drain regions.

In another embodiment, the partial insulation layer is formed to a thickness that prevents formation of a parasitic channel on the semiconductor substrate beneath the partial insulation layer.

In another embodiment, the device further comprises a device isolation layer defining an active region including the conductive regions and the channel layer and is connected with the partial insulation layer in the first direction.

In another embodiment, the partial insulation layer and the device isolation layer are formed of substantially the same insulation material.

In another embodiment, the partial insulation layer is separated from the device isolation layer in the second direction by the conductive regions.

In another embodiment, the channel layer is formed in the shape of a nanowire.

In another embodiment, the channel layer is a Si (silicon) layer.

In another embodiment, the gate insulation layer substantially encompasses the channel layer except for a portion of the channel layer contacting the partial insulation layer.

In another embodiment, the gate electrode layer extends in the first direction.

In another embodiment, the gate electrode layer substantially encompasses the gate insulation layer except for a portion of the gate insulation layer contacting the partial insulation layer.

In another aspect, the present invention is directed to a method of fabricating a semiconductor device with multiple channels comprising: sequentially forming a sacrificial layer and a first semiconductor layer on a semiconductor substrate, the sacrificial layer and the first semiconductor layer extending in a first direction and having a predetermined width in a second direction that is at an angle relative to the first direction; forming a second semiconductor layer on the semiconductor substrate and the sacrificial layer such that the second semiconductor layer covers the sacrificial layer; forming a mask layer defining an active region on the second semiconductor layer; removing portions of the second semiconductor layer, the sacrificial layer and the semiconductor substrate using the mask layer as an etch mask to form a recess region; removing the sacrificial layer; filling a space created by removing the sacrificial layer to form a partial insulation layer and filling the recess region to form a device isolation layer; removing the mask layer to a predetermine width in the second direction to form an opening exposing an upper portion of the second semiconductor layer; removing the exposed upper portion of the second semiconductor layer to provide a channel layer in the form of at least two bridges contacting the partial insulation layer, the at least two bridges being spaced apart from each other in the first direction and connecting the conductive regions with each other in the second direction; forming a gate insulation layer on the channel layer; and forming a gate electrode layer on the gate insulation layer.

In one embodiment, forming the sacrificial layer and the first semiconductor layer having the predetermined width includes: sequentially forming the sacrificial layer and the first semiconductor layer on the semiconductor substrate, the sacrificial layer and the first semiconductor layer having an etch selectivity to each other; forming the mask layer on the first semiconductor layer, the mask layer extending in the first direction and having a predetermined width; and patterning the first semiconductor layer and the sacrificial layer using the mask layer as an etch mask.

In another embodiment, the first semiconductor layer and the sacrificial layer have an etch selectivity of greater than approximately 30.

In another embodiment, the sacrificial layer is a SiGe (silicon germanium) layer.

In another embodiment, the first semiconductor layer, the sacrificial layer, and the second semiconductor layer are formed by an epitaxial growth method.

In another embodiment, removing the sacrificial layer proceeds with using one selected from the group consisting of a mixture solution including $H_2O_2$, HF and $CH_3COOH$, another mixture solution including $NH_4OH$, $H_2O_2$ and deionized $H_2O$, and an etch solution including $C_2H_4O_3$.

In another embodiment, forming the channel layer includes: forming a spacer on inner sidewalls of the mask layer disposed on the second semiconductor layer within the opening, the spacer having an etch selectivity to the second semiconductor layer; and removing the second semiconductor layer using the spacer and the mask layer as an etch mask to expose the partial insulation layer.

In another embodiment, prior to forming the gate insulation layer, the method further comprises: removing the spacer and the mask layer; and removing an upper portion of the device isolation layer such that the channel layer is exposed.

In another embodiment, the method further comprises rounding the exposed channel layer by a hydrogen annealing process prior to the forming of the gate insulation layer.

In another embodiment, prior to forming the gate insulation layer, the method further comprises: performing a thermal oxidation process on the exposed channel layer to form a thermal oxide layer on the channel layer; removing the thermal oxide layer; and repeating the forming of the thermal oxide layer and the removing of the thermal oxide layer to reduce a diameter of the channel layer.

In another embodiment, forming the gate electrode layer includes: filling the removed upper portion of the device isolation layer except for the partial insulation layer on which the channel layer of the first direction is formed, so that the device isolation layer is at substantially the same upper level as an upper portion of the channel layer; and forming the gate electrode layer encompassing the gate insulation layer extending in the first direction and formed on the channel layer.

In another embodiment, the method further comprises performing a trimming process to reduce a width of the gate electrode layer uniformly after the forming of the gate electrode layer.

BRIEF DESCRIPTION OF THE DRAWINGS

The above and other features and advantages of the present invention will become more apparent by describing in detail exemplary embodiments thereof with reference to the attached drawings in which:

FIGS. 1A through 10A are perspective views illustrating a method of fabricating a semiconductor device with multiple channels according to an embodiment of the present invention;

FIGS. 1B through 10B are cross-sectional views of the semiconductor device with the multiple channels taking along a line B-B of FIG. 1A; and FIGS. 1C through 10C are cross-sectional views of the semiconductor device with the multiple channels taking along a line C-C of FIG. 1A.

DETAILED DESCRIPTION OF THE INVENTION

Figure 1A:
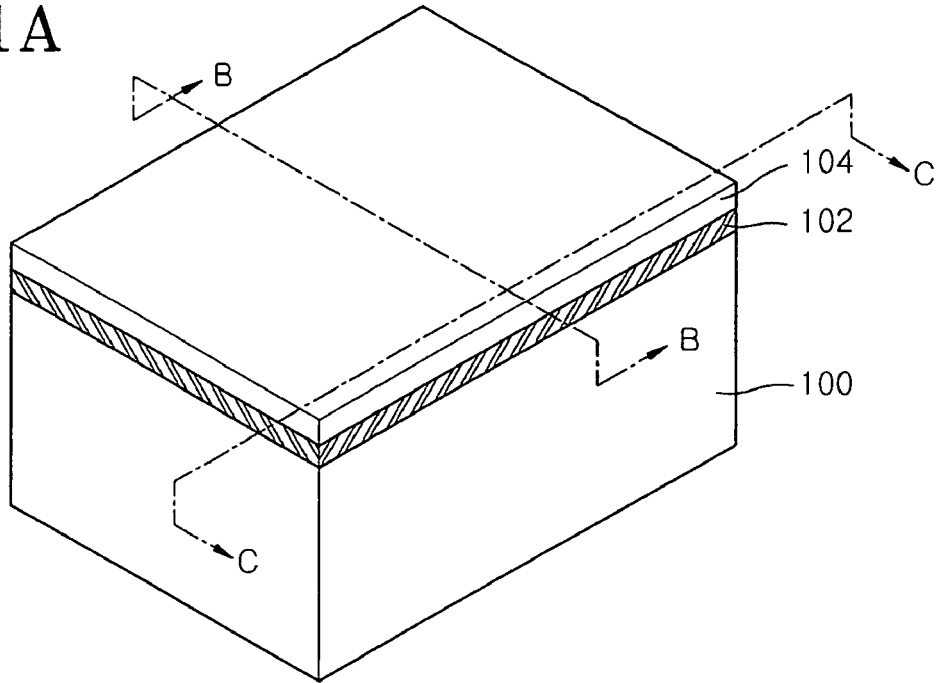

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete. Like reference numerals in the drawings denote like elements, and thus their description will be omitted.

A semiconductor device with multiple channels, wherein a portion of a channel layer contacts a partial insulation layer, and a method of fabricating the same will be described according to an embodiment of the present invention. The channel layer is formed on the partial insulation layer to prevent formation of a parasitic channel on a semiconductor substrate beneath the channel layer. Also, conductive regions serving as a source and a drain region are in contact with the semiconductor substrate, and a sacrificial layer does not remain in the conductive regions.

FIGS. 1A through 10A are perspective views illustrating a method of fabricating a semiconductor device with multiple channels according to an embodiment of the present invention. FIGS. 1B through 10B are cross-sectional views of the semiconductor device with the multiple channels taking along a line B-B of FIG. 1A. FIGS. 1C through 10C are cross-sectional views of the semiconductor device with the multiple channels taking along a line C-C of FIG. 1A. Particularly, the line C-C is set to cut a channel layer 122 illustrated in FIG. 8B.

Figure 1B:
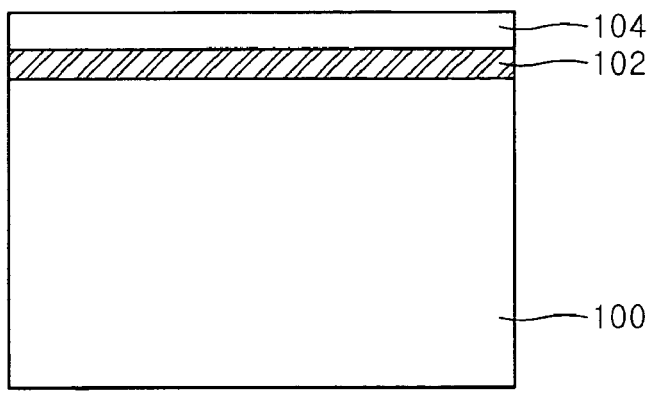
Figure 1C:
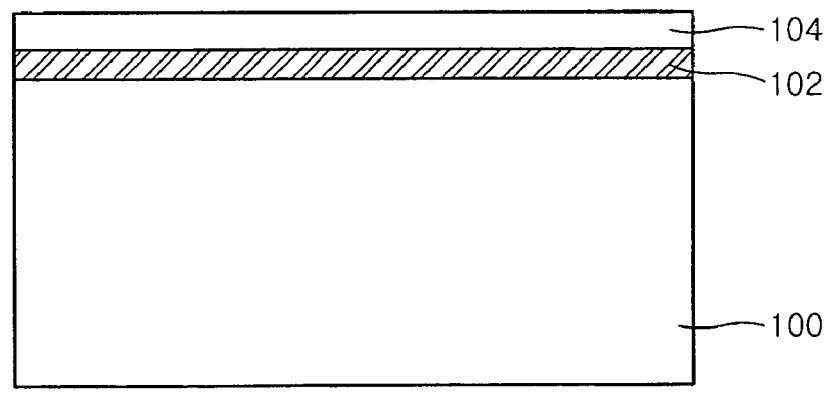

Referring to FIGS. 1A, 1B and 1C, a sacrificial layer 102 is formed on a semiconductor substrate 100, which is formed of single crystalline silicon. The sacrificial layer 102 has an etch selectivity to the semiconductor substrate 100. A first semiconductor layer 104 having an etch selectivity to the sacrificial layer 102 is formed on the sacrificial layer 102. The sacrificial layer 102 is formed of a material that has an etch selectivity to both the semiconductor substrate 100 and the first semiconductor layer 104. Particularly, the etch selectivity of the first semiconductor layer 104 relative to the sacrificial layer 102 may be greater than approximately 30. In the present described embodiment, the sacrificial layer 102 is formed of silicon germanium (SiGe), and the first semiconductor layer 104 is formed of silicon. An epitaxial growth method, which provides an excellent thickness control and suitable surface characteristics, is employed to form the sacrificial layer 102 and the first semiconductor layer 104.

For the epitaxial growth method of forming the sacrificial layer 102, i.e., the SiGe layer, a silicon (Si) source gas may be selected from the group consisting of $SiH_4$, $SiH_2Cl_2$, $SiCl_4$, and $Si_2H_6$. $GeH_4$ gas may be used as a germanium (Ge) source gas. In the SiGe layer 102, a concentration of Ge may range from approximately 10% to approximately 30%. The thickness of the SiGe layer 102 determines the thickness of a partial insulation layer 113 (refer to FIG. 6B). Especially, the thickness of the SiGe layer 102 is in a range that does not allow formation of a parasitic channel on the semiconductor substrate 100 disposed beneath the partial insulation layer 113.

For the epitaxial growth method of forming the semiconductor layer 104, i.e., the Si layer, a Si source gas may be selected from the group consisting of $SiH_4$, $SiH_2Cl_2$, $SiCl_4$, and $Si_2H_6$. The sacrificial layer 102 and the first semiconductor layer 104 can be formed using a chemical vapor deposition (CVD) method. In addition to SiGe, the sacrificial layer 102 may be formed of a silicon oxide material.

Figure 2A:
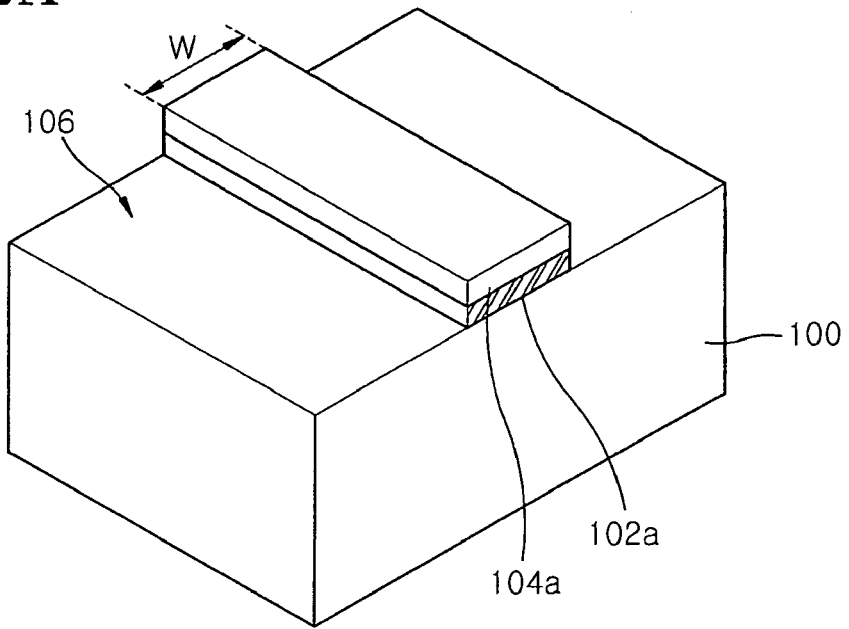
Figure 2B:
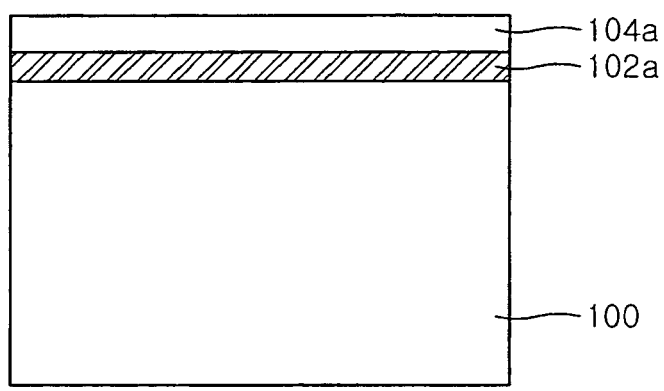
Figure 2C:
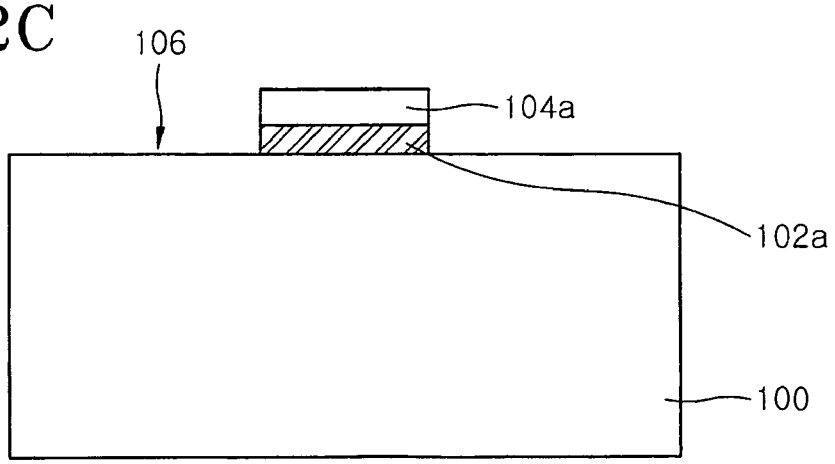

Referring to FIGS. 2A, 2B and 2C, a first semiconductor pattern 104a and a sacrificial pattern 102a are formed by performing a typical method such as an anisotropic dry etching process, as known in the art. The first semiconductor pattern 104a extends in a direction toward a region where a gate electrode is formed and has a predetermined width W. The anisotropic dry etching process allows the first semiconductor pattern 104a and the sacrificial pattern 102a to have substantially the same sidewall profile and exposes an upper portion of the semiconductor substrate 100. Although not illustrated, the upper portion of the semiconductor substrate 100 may be over etched to a depth larger than that of the sacrificial pattern 102a. As a result, the etched upper portion of the semiconductor substrate 100 becomes a recess region 106, which exposes the sidewalls of the first semiconductor pattern 104a and the sacrificial pattern 102a. The predetermined width W of the first semiconductor pattern 104a may be determined in consideration of the fact that the width of the first semiconductor pattern 104a eventually determines the width of the partial insulation layer 113 (refer to FIG. 6B).

Figure 3A:
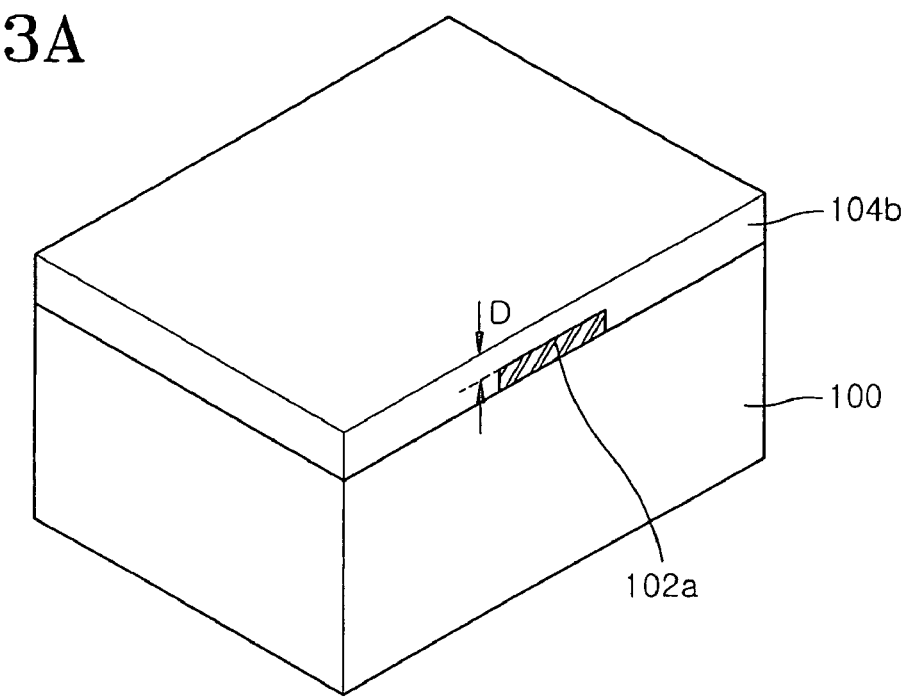
Figure 3B:
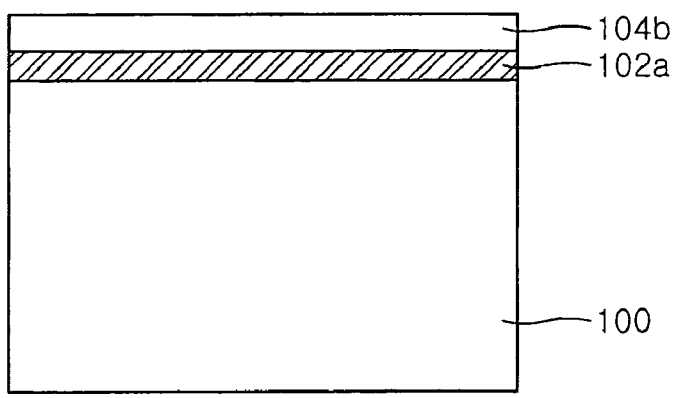
Figure 3C:
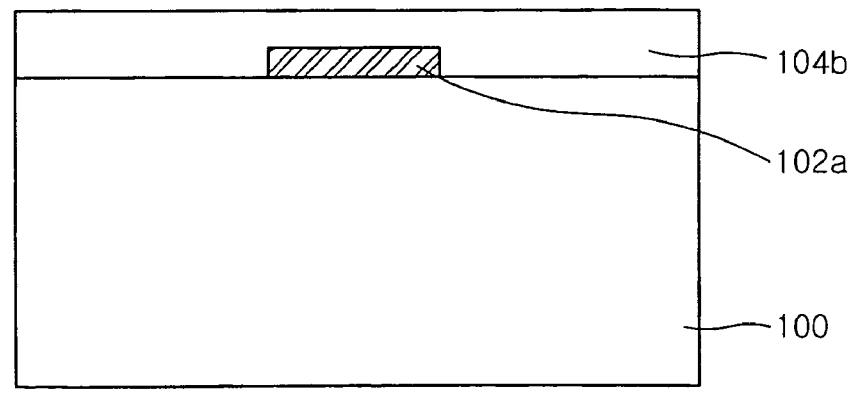

Referring to FIGS. 3A, 3B and 3C, a second semiconductor layer 104b is formed using an epitaxial growth method, as well known in the art. The second semiconductor layer 104b fills the first recess regions 106 and is grown to a predetermined thickness D over the top of the sacrificial pattern 102a. The second semiconductor layer 104b may be formed of substantially the same material that is used for forming the first semiconductor pattern 104a, e.g., the Si layer. Therefore, the second semiconductor layer 104b can be defined to include the first semiconductor pattern 104a. The predetermined thickness D of the second semiconductor layer 104b is determined in consideration of a diameter of a channel layer 122 that is eventually formed (refer to FIG. 8B). If the channel layer 122 is in a range of approximately 10 nm to approximately 30 nm in thickness, the predetermined thickness D of the second semiconductor layer 104b ranges from approximately 15 nm to approximately 40 nm. In other words, the predetermined thickness D of the second semiconductor layer 104b is slightly larger than the intended thickness of the channel layer to be formed. The sacrificial pattern 102a is encompassed by the semiconductor substrate 100 and the second semiconductor layer 104b.

Figure 4A:
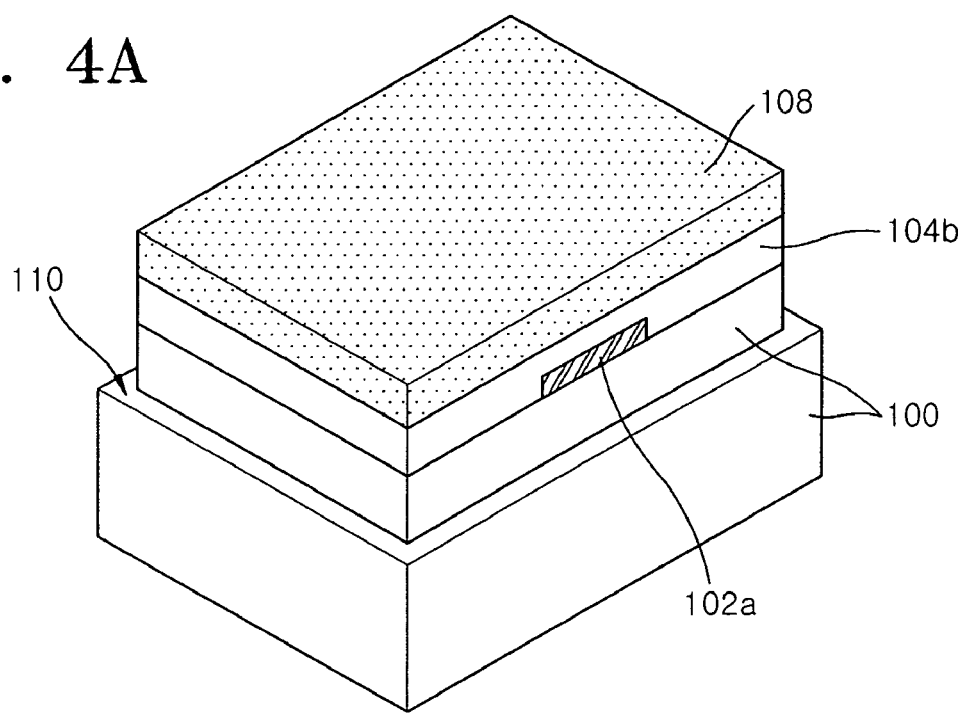
Figure 4B:
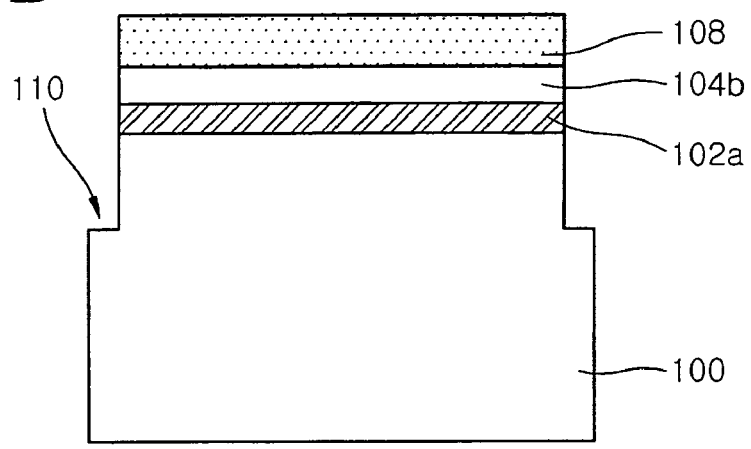
Figure 4C:
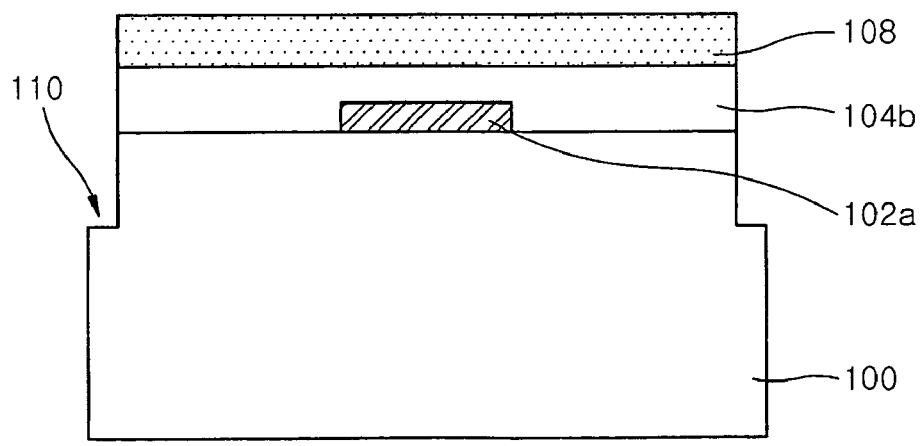

Referring to FIGS. 4A, 4B and 4C, a mask layer 108, which defines an active region of the second semiconductor layer 104b, is formed on the second semiconductor layer 104b using a lithography process. The mask layer 108 is formed of a material that has an etch selectivity with respect to the second semiconductor layer 104b, the sacrificial pattern 102a and the semiconductor substrate 100. For instance, the mask layer 108 may be formed of a silicon nitride material. Portions of the second semiconductor layer 104b, the sacrificial pattern 102a and the semiconductor substrate 100 are anisotropically dry etched using the mask layer 108 as an etch mask to form a second recess region 110. Hence, the second recess region 110 isolates the portions of the second semiconductor layer 104b, the sacrificial pattern 102a and the semiconductor substrate 100 and exposes sidewalls thereof.

Figure 5A:
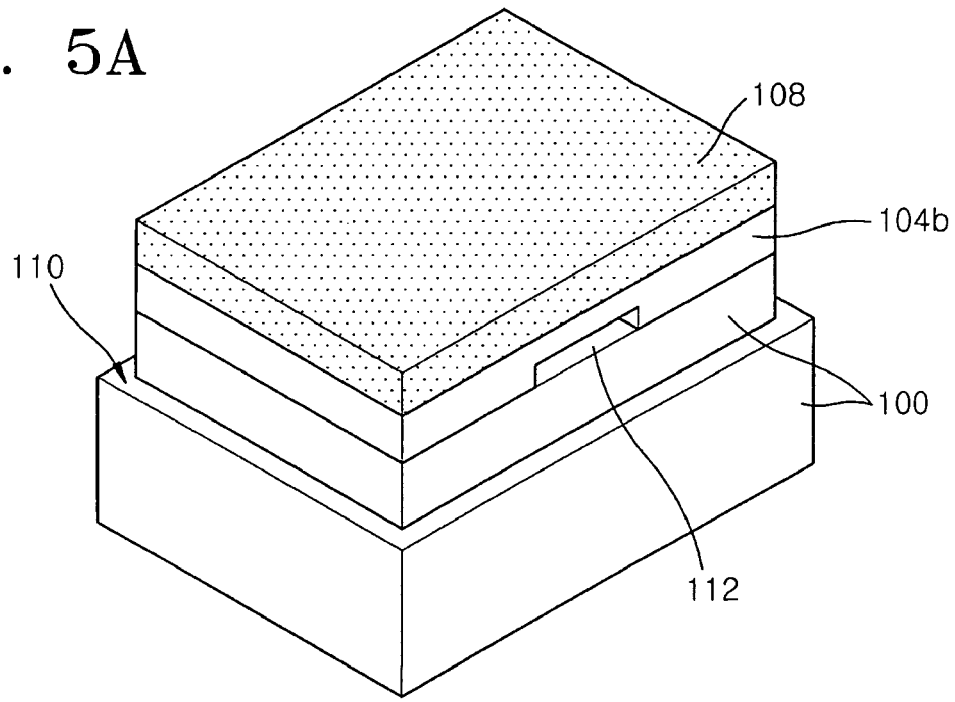
Figure 5B:
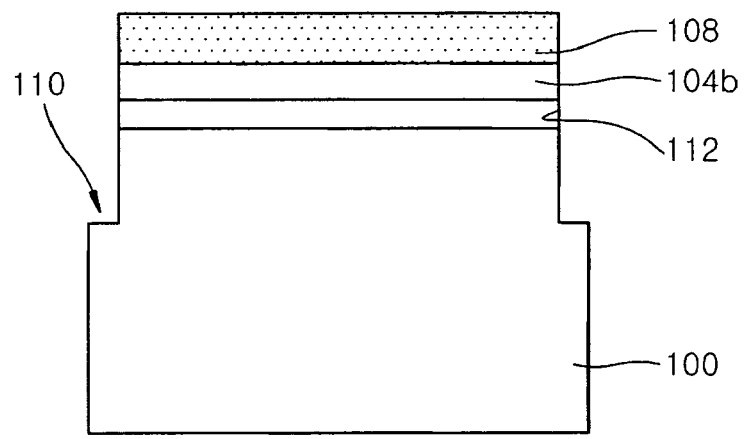
Figure 5C:
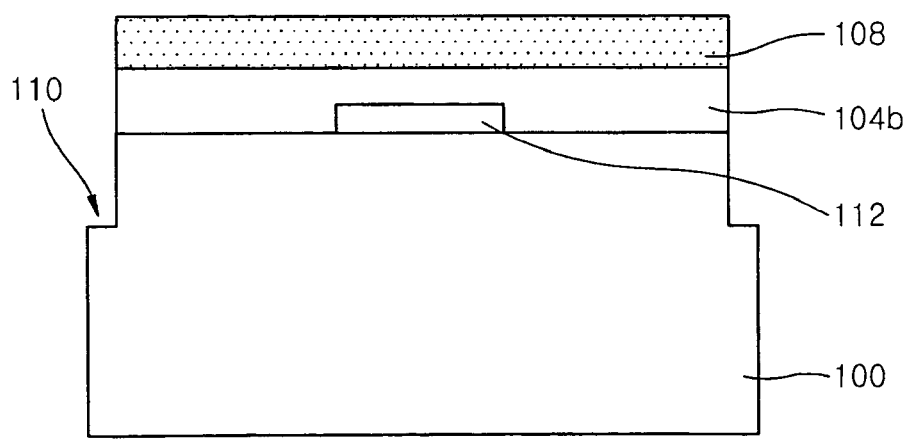

Referring to FIGS. 5A, 5B and 5C, the sacrificial pattern 102a, which is disposed on the semiconductor substrate 100 being encompassed by the second semiconductor layer 104b, is removed to form a void or space 112. The sacrificial pattern 102a, i.e., the patterned SiGe layer, can be removed, for example, using a mixture solution including $H_2O_2$, HF and $CH_3COOH$, another mixture solution including $NH_4OH$, $H_2O_2$ and deionized $H_2O$, or an etch solution including $C_2H_4O_3$.

In more detail, a wet etching process is used to remove the patterned sacrificial pattern 102a, i.e., the patterned SiGe layer 102a, instead of a chemical dry etching process. Additionally, using a wet etching solution having an etch rate of several hundreds of angstroms (Å) per minute can reduce the etching time to a greater extent. Such a wet etching solution may be a mixture solution including $NH_4OH$, $H_2O_2$ and deionized $H_2O$. For instance, a standard cleaning (SC)-1 solution including $NH_4OH$, $H_2O_2$ and deionized $H_2O$ in a ratio of approximately 1 to approximately 5 to approximately 1 may be used, or a SC-1 solution including the same but with an increased ratio of deionized $H_2O$, e.g., a ratio of approximately 1 to approximately 5 to approximately 20, may also be used. When the wet etching solution is heated to approximately 40° C. to approximately 75° C., the patterned SiGe layer 102a can be effectively removed.

Hereinafter, the etching of the patterned SiGe layer 102a using a mixture solution including $NH_3$, $H_2O_2$ and deionized $H_2O$ will be described in detail.

First, $H_2O_2$ forms a surface oxide layer. Since $H_2O_2$ is decomposed to $H_2O$ and O, $H_2O_2$ has a strong oxidizing ability. Thus, $H_2O_2$ oxidizes Si and Ge rapidly. Second, $NH_3$ is disassociated into $NH_4^+$ ions and $OH^-$ ions within the deionized $H_2O$. The $OH^-$ ions separate Si oxides and Ge oxides from the surface of the patterned SiGe layer 102a. This operation is a lift-off event by the $OH^-$ ions. Third, the $OH^-$ ions are adsorbed on the surface of the patterned SiGe layer 102a to give an electrostatic repulsive force, which is used to prevent the separated Si oxides and Ge oxides from being re-adsorbed onto the patterned SiGe layer 102a. This operation is a termination event by the $OH^-$ ions.

Since $H_2O_2$ is an acid solution, a pH level varies depending on a mixing ratio of $NH_3$ to $H_2O_2$. An amount of Si and Ge to be etched varies depending on the mixing ratio of $NH_3$ to $H_2O_2$, i.e., a change in pH. Thus, an appropriate mixing ratio of $NH_3$ to $H_2O_2$ needs to be used to prevent a Si pitting event and provide an appropriate etch rate. When the mixture solution is used at high temperature, e.g., at approximately 70° C., an evaporation rate of $NH_3$ vapor is increased. Hence, an additional supply of $NH_3$ is required.

In the first operation, which is an oxidation process, Ge is oxidized faster than Si, and thus, being etched faster than Si. However, as Ge of the SiGe layer 102, which includes Ge and Si mixed together, is etched rapidly, any remaining Si-Ge layer becomes unstable. Thus, Si is more likely to be etched by an etching solution. For this reason, an etch rate of the patterned SiGe layer 102a is larger than that of the second semiconductor layer 104b, e.g., the Si layer.

Figure 6A:
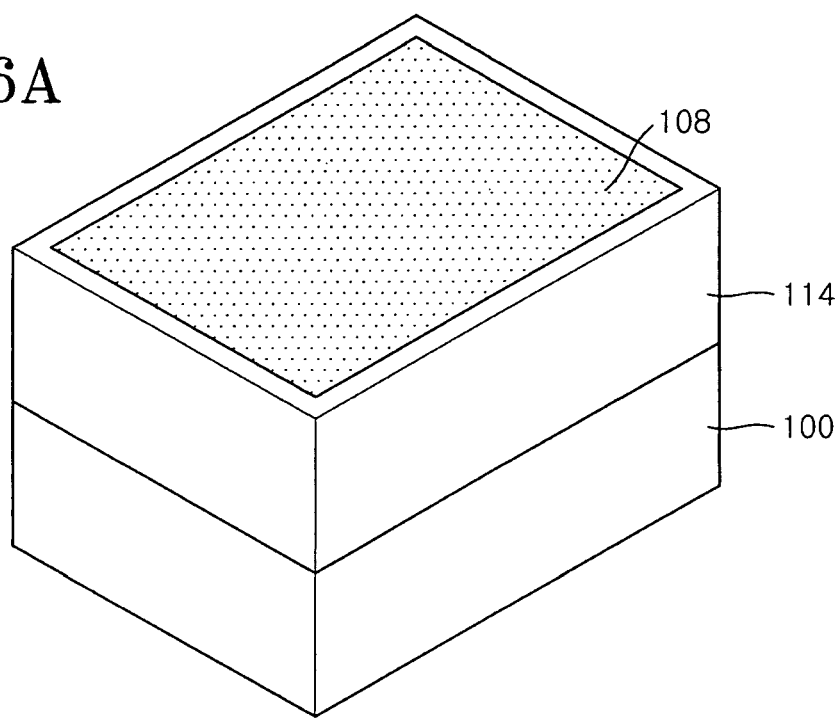
Figure 6B:
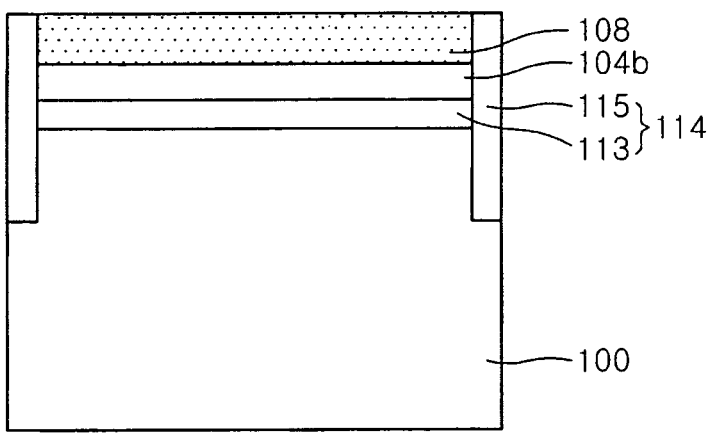
Figure 6C:
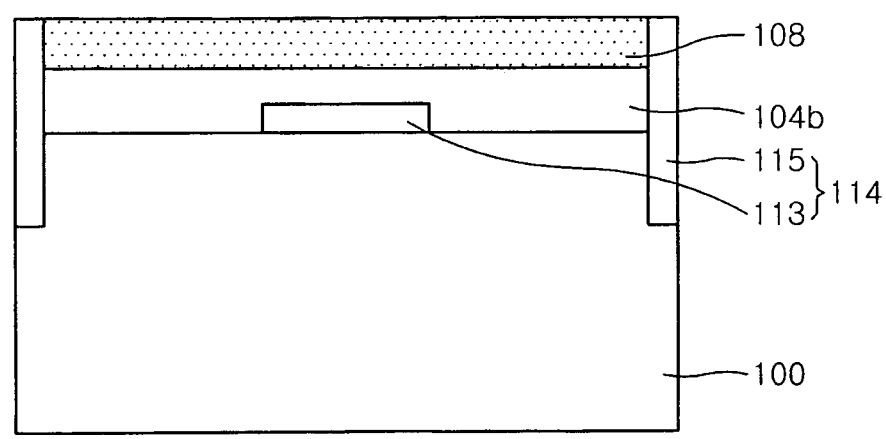

Referring to FIGS. 6A, 6B and 6C, an insulation material is filled into the void or space 112 and the second recess region 110 to form a partial insulation layer 113 and a first device isolation layer 115. Hereinafter, the partial insulation layer 113 and the first device isolation layer 115 will be referred to as "burial layer 114." The burial layer 114 includes one selected from the group consisting of undoped silicate glass (USG), high density plasma (HDP) oxide, tetraethyl orthosilicate (TEOS) obtained by a plasma enhanced chemical vapor deposition (PECVD) method, oxide obtained by a PECVD method, and a combination thereof. Among the listed insulation materials, HDP oxide may be appropriate for the burial because HDP oxide has a dense layer property and a favorable gap-fill property. In some cases, a thin middle temperature oxide layer may be formed prior to the gap-filling using the HDP oxide. As described above, the partial insulation layer 113 is formed to a thickness that does not allow formation of a parasitic channel on the semiconductor substrate 100 disposed beneath the partial insulation layer 113.

Figure 7A:
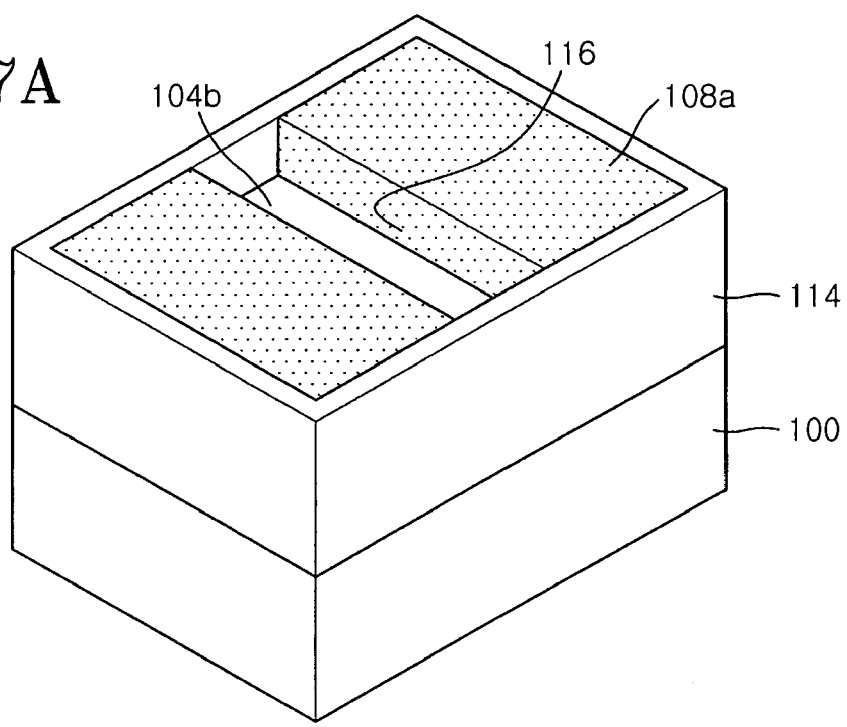
Figure 7B:
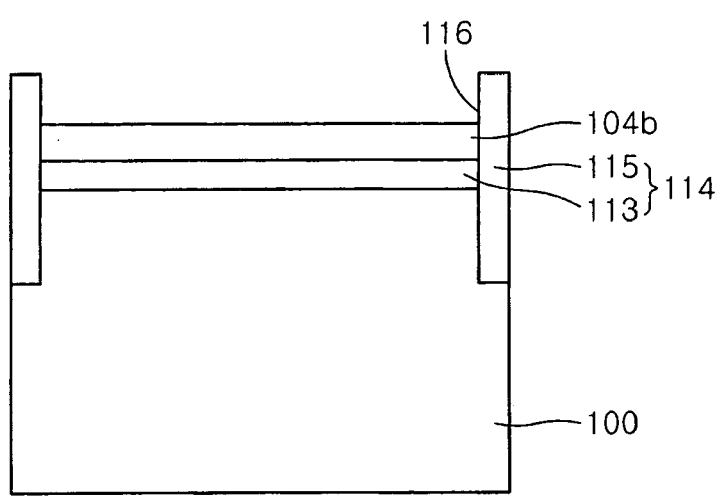
Figure 7C:
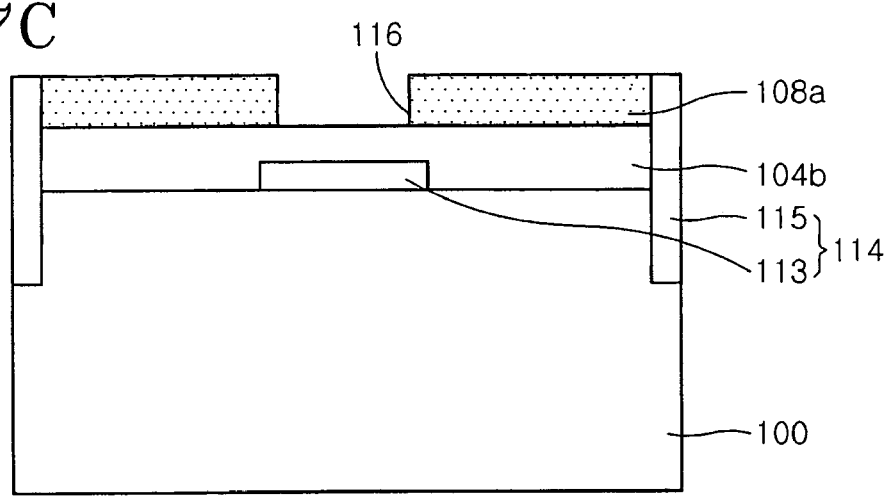

Referring to FIGS. 7A, 7B and 7C, a predetermined width of the mask layer 108 is removed in a first direction to thereby form a first opening 116 exposing an upper portion of the second semiconductor layer 104b. Herein, a reference numeral 108a denotes a patterned mask layer 108. The first opening 116 is allocated on the second semiconductor layer 104b formed on the partial insulation layer 113. The first opening 116 exposes a portion of sidewalls of the first device isolation layer 115 in the first direction, and exposes sidewalls of the patterned mask layer 108a in a second direction directed to a predetermined angle from the first direction, e.g., the direction orthogonal to the first direction. A portion of the mask layer 108 can be removed via various methods. For instance, a wet etching process using a solution of $H_3PO_4$ acid or an anisotropic dry etching process may be used to remove the portion of the mask layer 108.

Figure 8A:
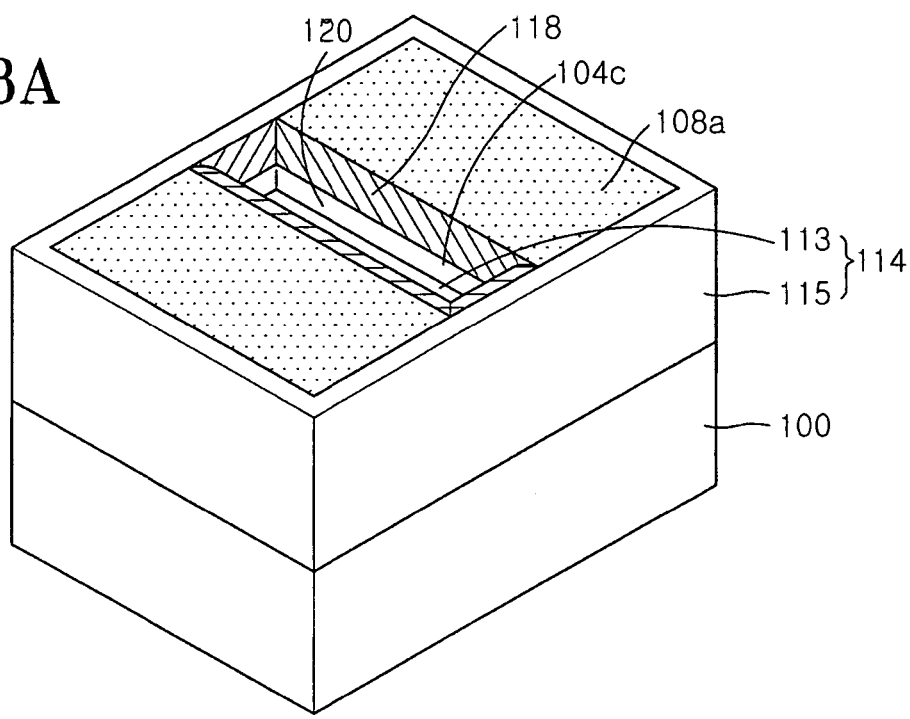
Figure 8B:
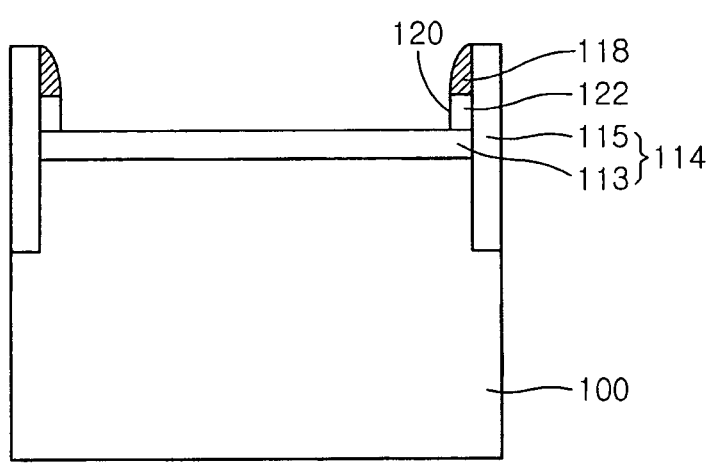
Figure 8C:
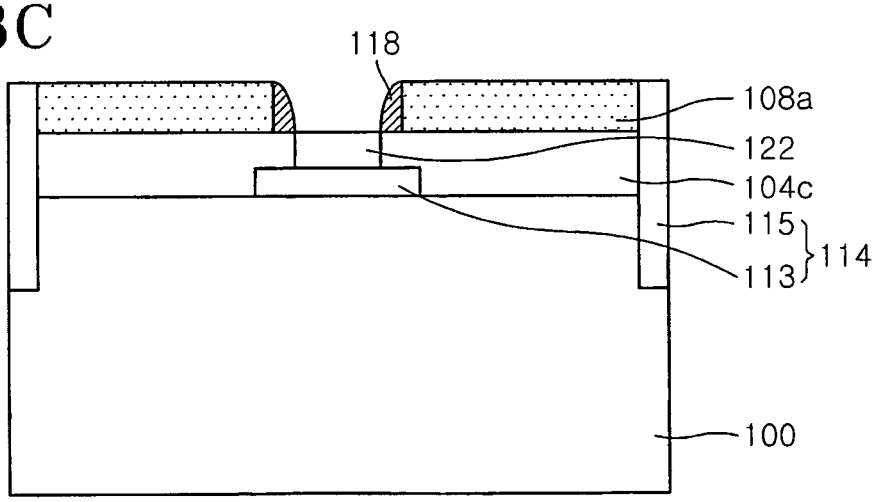

Referring to FIGS. 8A, 8B and 8C, a spacer 118, which define the diameter of a channel layer that is subsequently formed, is formed on the inner sidewalls of the first opening 116. The spacer 118 may be formed of a silicon oxide material having an etch selectivity to the patterned mask layer 108a illustrated in FIG. 7A and the second semiconductor layer 104b. More specific to the formation of the spacer 118, a silicon oxide layer is formed inside the first opening 116 and then, anisotropically dry etched to form the spacer 118. The second semiconductor layer 104b is removed using the patterned mask layer 108a and the spacer 118 as an etch mask to expose the upper surface of the partial insulation layer 113.

A portion of the second semiconductor layer 104b, which is protected by the spacer 118 during the above etching process, becomes a channel layer 122 in the first direction, while another portion of the second semiconductor layer 104b in the second direction becomes a third semiconductor layer 104c, which covers sidewalls and an upper portion of the partial insulation layer 113 and is connected with the semiconductor substrate 100. The third semiconductor layer 104c can serve as a conductive region, for instance, a source region and a drain region. A second opening 120 defined by the channel layer 122 and the third semiconductor layer 104c has a smaller width than the first opening 116 by the width of the spacer 118.

According to the present embodiment, the channel layer 122 is disposed on the partial insulation layer 113 in contact with the partial insulation layer 113. As the semiconductor substrate 100 and the channel layer 122 are electrically insulated from each other by the partial insulation layer 113, it is possible to prevent formation of an unintended parasitic channel on the semiconductor substrate 100. As described above, current usually leaks toward the lateral sides of the source region and the drain region or toward the semiconductor substrate 100 due to the sacrificial layer. However, since no sacrificial layer remains in the source region and in the drain region of the device to be formed, the occurrence of leakage current can be impaired. Also, since the third semiconductor layer 104c is connected with the semiconductor substrate 100, a sufficient volume of the third semiconductor layer 104c can be secured, and thus, a low level of electrical resistance can be obtained.

Figure 9A:
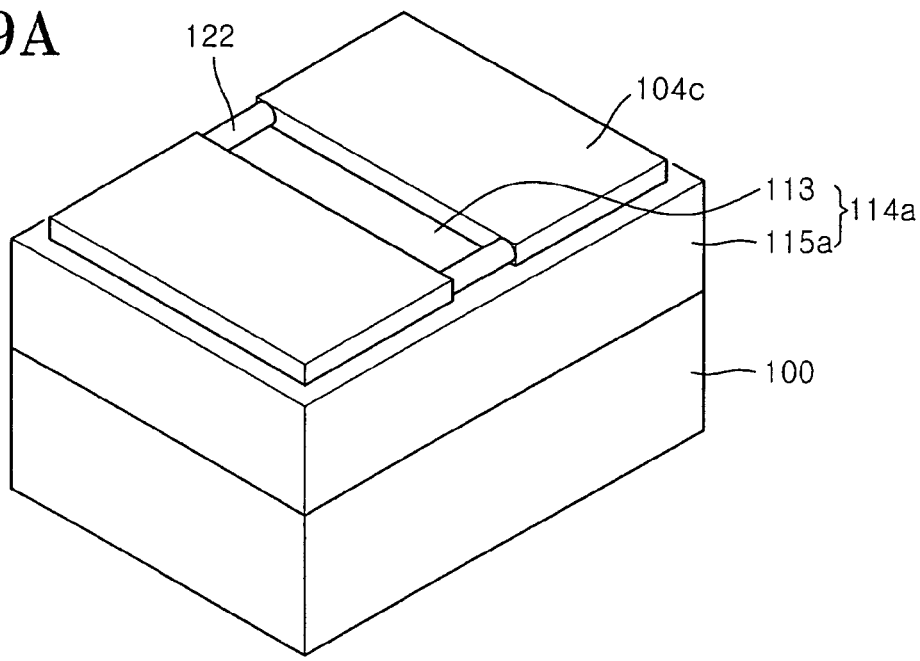
Figure 9B:
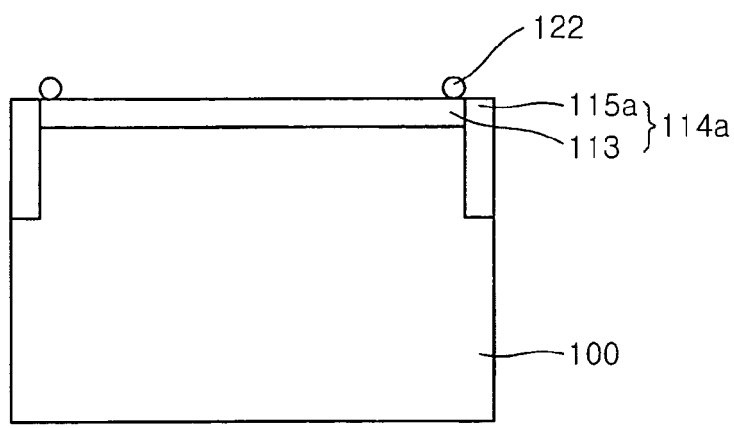
Figure 9C:
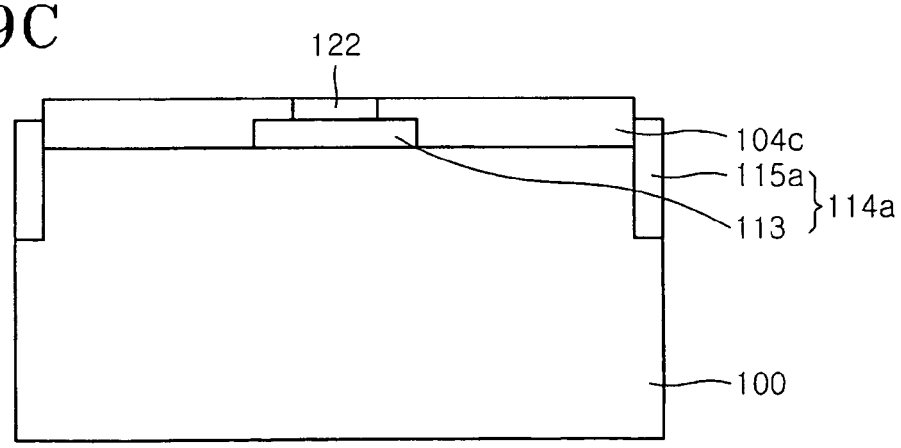

Referring to FIGS. 9A, 9B and 9C, the channel layer 122 can be formed to have various cross-sectional shapes such as a rectangle, a circle and an ellipse, for example in the shape of a nanowire. Particularly, when a cross-sectional area of the channel layer 122 is circular, the channel layer 122 has favorable electrical characteristics. To form the channel layer with the circular cross-sectional area, the spacer 118 and the patterned mask layer 108a (refer to FIG. 8A) are removed. An upper portion of the first device isolation layer 115 is removed to expose the channel layer 122, and, as a result, a patterned device isolation layer 115a is formed. Hereinafter, the patterned device isolation layer 115a will be referred to as a second device isolation layer. The spacer 118 and the first device isolation layer 115 can be removed by an isotropic wet etching process using buffer oxide etchant (BOE), which is a mixture solution including diluted HF and $NH_4F$, or HF and deionized $H_2O$. The patterned mask layer 108a can be removed by a wet etching process using $H_3PO_4$. The exposed channel layer 122 is rounded by a hydrogen annealing process, as known in the art.

A diameter of the channel layer 122 is decreased, depending on the desired device characteristics. A method of decreasing the diameter of the channel layer 122 is to perform a thermal oxidation process on the exposed channel layer 122 and form a thermal oxide layer on the channel layer 122. Afterward, an isotropic wet etching process using BOE, i.e., the mixture solution including diluted HF and $NH_4F$, or HF and deionized $H_2O$, is performed to remove the thermal oxide layer. When the formation of the thermal oxide layer and the removal thereof are performed repeatedly, a desired diameter of the channel layer 122 can be obtained. The channel layer 122 therefore forms bridges that are spaced apart from each other and connecting the conductive third semiconductor layers 104c.

Figure 10A:
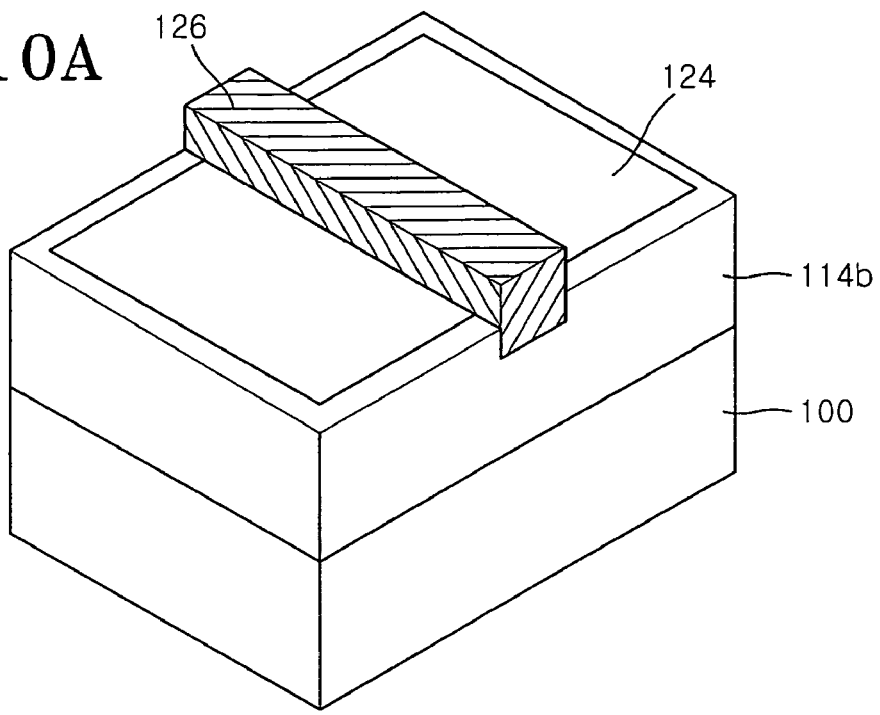
Figure 10B:
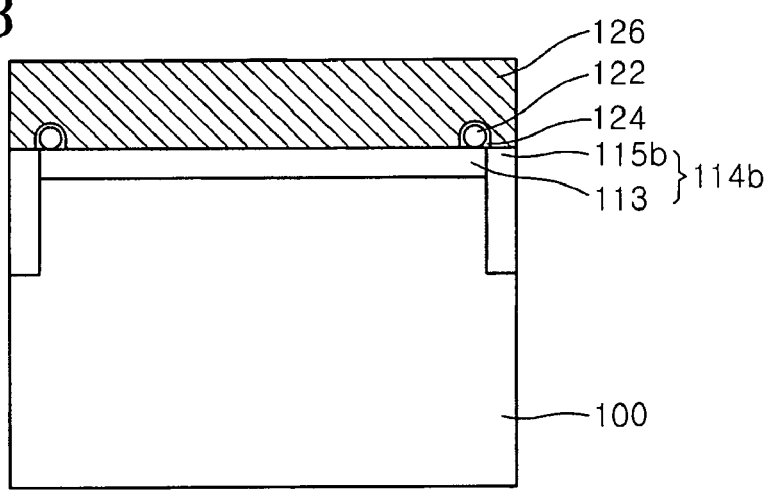
Figure 10C:
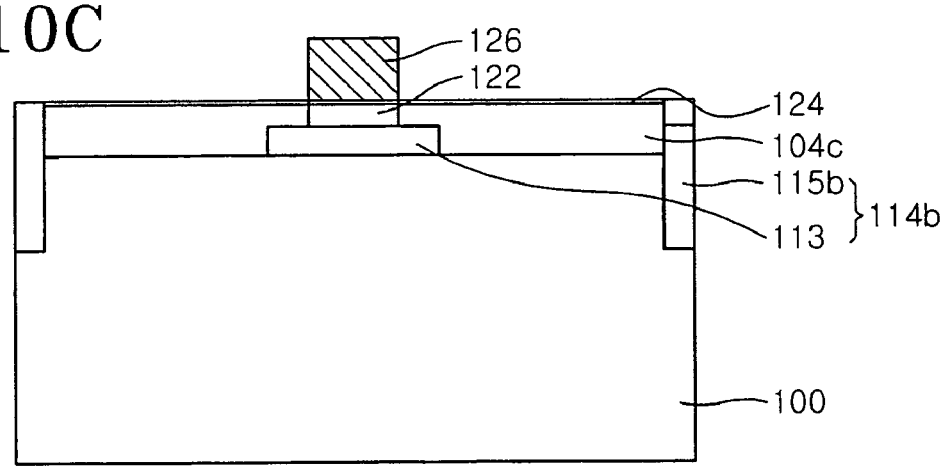

Referring to FIGS. 10A, 10B and 10C, a gate insulation layer 124 is formed to encompass a portion of the channel layer 122 except for another portion of the channel layer 122 contacting the partial insulation layer 113. Although the gate insulation layer 124 may be a thermal oxide layer, which is formed through a thermal oxidation process, the gate insulation layer 124 may be formed of various other materials.

A gate electrode layer 126 is formed to encompass a portion of the gate insulation layer 124 disposed on the portion of the channel layer 122. More specifically, the removed portion of the second device isolation layer 11 5a is filled again to form a third device isolation layer 115b substantially at the same level with the upper surface of the third semiconductor layer 104c. The gate electrode layer 126 is then formed such that the gate electrode layer 126 extends to the first direction and encompasses the channel layer 122. The gate electrode layer 126 may comprise a single layer of polysilicon, a mixed layer including polysilicon and a conductive material, which has a lower resistivity value than polysilicon, a single layer of a low resistance metal, or a mixed layer of low resistance metals. Also, the gate electrode layer 126 may optionally be formed by performing a lithography process or a damascene process, as known in the art.

In some cases, a trimming process may be performed to reduce a width of the gate electrode layer 126. Since a conventional gate electrode layer is formed underneath the channel layer, the trimming process decreases the width of the gate electrode layer disposed on the channel layer, but does not remove the gate electrode layer underneath the channel layer, thereby maintaining the same width of the gate electrode layer underneath the channel layer. Hence, the trimming process causes the gate electrode layer to have a non-uniform width. However, according to the present embodiment, since the gate electrode layer is not formed underneath the channel layer, the width of the gate electrode layer decreases uniformly as a result of the trimming process.

Prior to forming, or after forming the gate electrode layer 126, the third semiconductor layers 104c can be doped with impurities to form source and drain regions, according to known techniques.

According to the exemplary embodiments, the partial insulation layer electrically insulates the semiconductor substrate and the channel layer from each other, and thus, formation of an undesired parasitic channel on the semiconductor substrate can be prevented. Since the sacrificial layer does not remain in the source region and in the drain region, any occurrence of leakage current caused by the sacrificial layer can be impeded. The leakage current usually flows toward the lateral sides of the source region and the drain region or toward the semiconductor substrate.

Since the third semiconductor layer, which is a conductive region, is connected with the semiconductor substrate, the third semiconductor layer can be formed to have a sufficient volume. As a result, low electrical resistance can be obtained. Also, the gate electrode layer is not formed underneath the channel layer, and thus, the width of the gate electrode layer can be reduced uniformly by a trimming process.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device with multiple channels comprising:
   a semiconductor substrate;
   a pair of conductive regions spaced apart from each other on the semiconductor substrate and having sidewalls that face to each other;
   a lower insulation layer disposed on the semiconductor substrate between the conductive regions;
   a channel layer in the form of at least two bridges contacting the lower insulation layer, the at least two bridges being spaced apart from each other in a first direction and connecting the conductive regions with each other in a second direction that is at an angle relative to the first direction;
   a gate insulation layer on the channel layer;
   a gate electrode layer on the gate insulation layer and surrounding a portion of the channel layer; and
   a device isolation layer defining an active region including the conductive regions and the channel layer and is connected with the lower insulation layer in the first direction, wherein the lower insulation layer is separated from the device isolation layer in the second direction by the conductive regions.

2. The semiconductor device of claim 1, wherein the conductive regions are impurity doped source and drain regions.

3. The semiconductor device of claim 1, wherein the lower insulation layer is formed to a thickness that prevents formation of a parasitic channel on the semiconductor substrate beneath the lower insulation layer.

4. The semiconductor device of claim 1, wherein the lower insulation layer and the device isolation layer are formed of substantially the same insulation material.

5. The semiconductor device of claim 1, wherein the channel layer is formed in the shape of a nanowire.

6. The semiconductor device of claim 1, wherein the channel layer is a Si (silicon) layer.

7. The semiconductor device of claim 1, wherein the gate insulation layer substantially encompasses the channel layer except for a portion of the channel layer contacting the lower insulation layer.

8. The semiconductor device of claim 1, wherein the gate electrode layer extends in the first direction.

9. The semiconductor device of claim 1, wherein the gate electrode layer substantially encompasses the gate insulation layer except for a portion of the gate insulation layer contacting the lower insulation layer.

* * * * *